(12) United States Patent
Lv et al.

(10) Patent No.: US 9,847,635 B2
(45) Date of Patent: Dec. 19, 2017

(54) POWER SUPPLY MODULE AND SOFT START METHOD

(71) Applicant: Emerson Network Power, Energy Systems, North America, Inc., Warrenville, IL (US)

(72) Inventors: Baoliang Lv, Shenzhen (CN); Guoyong Wang, Shenzhen (CN); Shiqiang Yu, Shenzhen (CN)

(73) Assignee: Vertiv Energy Systems, Inc., Lombard, IL (US)

( * ) Notice: Subject to any disclaimer, the term of this patent is extended or adjusted under 35 U.S.C. 154(b) by 140 days.

(21) Appl. No.: 14/224,771

(22) Filed: Mar. 25, 2014

(65) Prior Publication Data

US 2014/0375294 A1    Dec. 25, 2014

(30) Foreign Application Priority Data

Mar. 28, 2013 (CN) .......................... 2013 1 0105574

(51) Int. Cl.
*H02H 9/08* (2006.01)
*H02H 9/02* (2006.01)
(Continued)

(52) U.S. Cl.
CPC ................ *H02H 9/02* (2013.01); *G05F 5/00* (2013.01); *H01H 51/34* (2013.01);
(Continued)

(58) Field of Classification Search
CPC .......... H02M 1/36; H02M 1/32; H02H 9/001; H02H 9/02; H03K 17/0822; H01R 13/53; H01R 13/193; H01R 2103/00
(Continued)

(56) References Cited

U.S. PATENT DOCUMENTS 4,114,054 A     9/1978  Seo et al.
8,464,078 B2 *  6/2013  Brooks ..................... G06F 1/26
                                                 323/299
(Continued)

FOREIGN PATENT DOCUMENTS

CN    101925871    12/2010
CN    102739029    10/2012
(Continued)

*Primary Examiner* — Nguyen Tran
(74) *Attorney, Agent, or Firm* — Harness, Dickey & Pierce, P.L.C.

(57) ABSTRACT

Embodiments of the present invention provide a power supply module and a soft start method. The power supply module includes an input detection circuit configured to output a first notification signal to a trigger drive circuit when it is determined that the power supply module receives a power supply signal; the trigger drive circuit configured to, upon receipt of the first notification signal sent from the input detection circuit, wait for a predetermined duration without sending a drive signal to a current limiting circuit, and to send the driver signal to the current limiting circuit when the predetermined duration elapses; and the current limiting circuit configured to limit a current on a Direct Current (DC) bus of the power supply module when the drive signal is not received by the current limiting circuit, and not to limit the current on the DC bus upon receipt of the drive signal.

15 Claims, 9 Drawing Sheets

(51) Int. Cl.
　　　H01R 29/00　　　(2006.01)
　　　H01H 51/34　　　(2006.01)
　　　H01R 13/641　　(2006.01)
　　　H02H 9/00　　　 (2006.01)
　　　G05F 5/00　　　 (2006.01)
　　　H01R 13/713　　(2006.01)
　　　H02H 3/093　　　(2006.01)
　　　B60L 11/18　　　(2006.01)
　　　G01R 31/04　　　(2006.01)
　　　H03K 17/795　　 (2006.01)

(52) U.S. Cl.
　　　CPC ......... *H01R 13/641* (2013.01); *H01R 13/713* (2013.01); *H01R 29/00* (2013.01); *H02H 9/001* (2013.01); *H02H 9/002* (2013.01); *H02H 9/025* (2013.01); *B60L 11/1818* (2013.01); *B60L 2230/12* (2013.01); *B60L 2270/20* (2013.01); *G01R 31/043* (2013.01); *H02H 3/093* (2013.01); *H02H 9/004* (2013.01); *H03K 17/7955* (2013.01); *Y10T 307/918* (2015.04)

(58) Field of Classification Search
　　　USPC ...... 323/901, 908; 363/49, 50; 361/58, 93.1, 361/93.9; 439/269.1, 188, 181
　　　See application file for complete search history.

(56) References Cited

U.S. PATENT DOCUMENTS

| | | | |
|---|---|---|---|
| RE45,734 E * | 10/2015 | Hussein | |
| 2007/0279811 A1 | 12/2007 | Wang et al. | |
| 2009/0001995 A1 | 1/2009 | Satoh et al. | |
| 2010/0029110 A1* | 2/2010 | Kiryu | H01R 13/7038 439/188 |
| 2011/0058397 A1 | 3/2011 | Rizzo | |
| 2014/0125350 A1* | 5/2014 | Senba | G01R 31/025 324/509 |

FOREIGN PATENT DOCUMENTS

| | | |
|---|---|---|
| CN | 102820771 | 12/2012 |
| EP | 0034112 | 8/1981 |
| EP | 0602804 | 6/1994 |
| EP | 0690554 | 1/1996 |
| WO | 2006/083334 | 8/2006 |

* cited by examiner

POWER SUPPLY MODULE AND SOFT START METHOD

CROSS-REFERENCE TO RELATED APPLICATION

This application claims the benefit and priority of Chinese Application No. 201310105574.0, filed Mar. 28, 2013, the entire disclosure of which is incorporated herein by reference.

FIELD OF THE INVENTION

The invention relates to the field of power electronic technology, and particularly to a power supply module and a soft start method.

BACKGROUND OF THE INVENTION

A power supply module such as an Alternating Current (AC)/Direct Current (DC) rectifier module and a DC/DC converter has been widely applied to the fields of communication, computer, automobile and home appliance. A DC bus in the power supply module circuit is generally connected to an electrolytic capacitor and other electronic devices. When the power supply module connected to a power supply is started at the first time or when the power supply module is hot plugged on a power supply system, since a voltage on the DC bus in the power supply module does not necessarily reach a voltage resulted from an AC input after being rectified or a voltage of a DC input, a big current shock will be caused to the electrolytic capacitor connected to the DC bus, and the big current shock will result in damage to the electrolytic capacitor and occurrence of electric arc in a connection terminal connecting the power supply system and the power supply module, which may damage the connection terminal.

For the above problems, there are two solutions in the prior art, one is that soft start of the DC bus is realized in a way of cooperating a structure of mechanical lock with long and short pins of a connector; and another is that the soft start of the DC bus is realized by connecting a current-limiting resistor connected in parallel with a switch device into the DC bus.

The first solution is as shown in FIG. 1 or FIG. 2, in which a current limiting resistor R1' is connected in one of two DC buses (the one of two DC buses may be the DC bus connected to an input terminal Input1 or may also be the DC bus connected to an input terminal Input2. In FIG. 1 and FIG. 2, the DC bus connected to the input terminal Input2 is taken as an example), the resistor R1' is connected to a longer pin of the input terminals in the power supply module including the two DC buses. When the power supply module is plugged into a power supply system which has been powered on, it can make sure that the longer pin of the input terminals in the power supply module first makes contact with the power supply system which has been powered on, and consequently the capacitor C1' between the two DC buses is charged via the current limiting resistor. The mechanical lock is then opened so that the power supply module is plugged into the right place completely. At that time, the longer pin connected to the resistor R1' is disconnected from the power supply system, and a pin of the input terminals in the power supply module which is connected to the input terminal Input2 is connected to the power supply system, and is connected to a pin in the output terminals of the power supply system which is in contact with the longer pin connected to the resistor R1' before the mechanical lock is opened. A difference between FIG. 1 and FIG. 2 is that signal input to the input terminal Input1 and the input terminal Input2 in FIG. 1 is a DC signal, and signal input to the input terminal Input1 and the input terminal Input2 in FIG. 2 is an AC signal, and the AC signal is converted into a DC signal via an AC/DC rectifier. A DC/AC converter or a DC/DC converter connected in parallel with the capacitor C1' is also included in FIG. 1 and FIG. 2. If the DC/AC converter is connected in parallel with the capacitor C1' in FIG. 1 and FIG. 2, an AC signal is output from the two output terminals Output1 and Output2 in FIG. 1 and FIG. 2, and if the DC/DC converter is connected in parallel with the capacitor C1' in FIG. 1 and FIG. 2, a DC signal is output from the two output terminals Output1 and Output2 in FIG. 1 and FIG. 2. A disadvantage of this solution is that, in this solution, first, the applying of delay is dependent on the structure of mechanical lock added to the power supply module, and since a duration of the delay is dependent on the capacitor C1' and the current limiting resistor R1', if the operation is too fast, there is a high difference between the voltage on the DC buses and the input DC voltage or the voltage of the DC signal obtained from the input AC signal after being rectified, which may also result in a big current shock and consequently result in damage to the electrolytic capacitor on the DC buses, and may damage the connection terminal connecting the power supply module including the DC buses and the power supply system. Therefore, it is apparent that the power supply module having such a structure has a high requirement on the skill of the operator. In addition, if the power supply module has been plugged into the power supply system, a big inrush current will be generated when the power supply system is powered on, although which inrush current will not damage the connection terminal connecting the power supply module and the power supply system, but will damage the electrolytic capacitor on the DC buses.

The second solution is as shown in FIG. 3 or FIG. 4. In FIG. 3, a current limiting resistor R1' being connected in parallel with a switch device 31 is connected to a DC bus connected to an input terminal DC+ or a DC bus connected to an input terminal DC− (in FIG. 3, the DC bus connected to the input terminal DC+ is taken as an example). In FIG. 4, a current limiting resistor R1' being connected in parallel with the switch device 31 is connected in series with a branch circuit where a capacitor C1' is located. Each of the DC buses in FIG. 3 and FIG. 4 receives a DC signal. When a power supply module including the DC buses shown in FIG. 3 or FIG. 4 is plugged into a power supply system that has been powered on or when the power supply system into which the power supply module is plugged is powered on at the first time, the capacitor C1' in the DC buses is charged at first by the power supply module via the current limiting resistor R1'. When it is detected that a voltage on the DC bus reaches a predetermined value, the switch device 31 is closed (turned on) to short-circuit the current limiting circuit R1' and a current flows through the switch device 31. In this way, the current flows through the current limiting resistor R1' when the power supply module including the DC buses is powered on to start, and the current flows through the switch device during normal operation, thus realizing the purpose of soft start. Compared with the first solution, in the second solution, no big inrush current will be generated whether when the power supply module is hot plugged or the power supply system including the power supply module is powered on. However, the second solution has disadvantages as follows. When the hot plug is performed repeatedly and if the operation is performed fast, the voltage on the DC bus in the power supply module will drop slowly after the power supply module is unplugged from the power supply system, and the power supply module is plugged into the power supply system fast again before the voltage drops to a shut-down determination voltage or a determination voltage for opening (turning off) the switch device. Since there is a difference between the DC voltage output from the power supply system and the DC voltage on the DC buses of the power supply module, a big inrush current may be generated, which may damage the capacitor C1' between the two DC buses and may damage the connection terminal connecting the power supply module and the power supply system.

In conclusion, in a case that the existing DC bus structure is employed, when the power supply module including the DC buses is hot plugged rapidly on the power supply system, a big inrush current may be generated, which may damage the capacitor between the two DC buses and damage the connection terminal connecting the power supply module including the DC buses to the power supply system.

SUMMARY OF THE INVENTION

Embodiments of the present invention provide a power supply module and a soft start method, so as to solve the problem that when the existing power supply module is hot plugged rapidly on the power supply system, a big inrush current may be generated, which may damage the capacitor between the two DC buses and damage the connection terminal connecting the power supply module including the DC buses and the power supply system.

In view of the above problem, an embodiment of the present invention provides a power supply module, including: DC buses, a current limiting circuit and a first capacitor, wherein the current limiting circuit is connected in a DC bus and the first capacitor is connected between two DC buses, or the current limiting circuit is connected between the two DC buses and then is connected in series with the first capacitor. The power supply module further includes a trigger drive circuit and an input detection circuit, wherein the input detection circuit is connected to the trigger drive circuit and the trigger drive circuit is then connected to the current limiting circuit.

The input detection circuit is configured to output a first notification signal to the trigger drive circuit when it is determined that the power supply module begins to receive a power supply signal.

The trigger drive circuit is configured to, upon receipt of the first notification signal sent from the input detection circuit, wait for a predetermined duration without sending a drive signal to the current limiting circuit, and to send the drive signal to the current limiting circuit when the predetermined duration elapses; and The current limiting circuit is configured to limit a current on the DC buses when the drive signal is not received by the current limiting circuit, and not to limit the current on the DC bus when the drive signal is received by the current limiting circuit.

An embodiment of the present invention provides a soft start method, including:
 outputting, by an input detection circuit, a first notification signal to a trigger drive circuit when it is determined that a power supply module begins to receive a power supply signal;
 waiting for a predetermined duration without sending a drive signal to a current limiting circuit by the trigger drive circuit when the first notification signal sent by the input detection circuit is received by the trigger drive circuit, and sending, by the trigger drive circuit, the drive signal to the current limiting circuit when the predetermined duration elapses; and
 limiting, by the current limiting circuit, a current on the DC buses when the drive signal is not received by the current limiting circuit, and not limiting, by the current limiting circuit, the current on the DC bus when the drive signal is received by the current limiting circuit.

The beneficial effect of the embodiment of the present invention is as follows.

In the power supply module and the soft start method provided by the embodiments of the present invention, the input detection circuit outputs a first notification signal to the trigger drive circuit when it is determined that the power supply module begins to receive a power supply signal, that is, the power supply module is plugged into the power supply system that has been powered on or the power supply system including the power supply module is started; upon receipt of the first notification signal, the trigger drive circuit waits for a predetermined duration without sending a drive signal to the current limiting circuit, so that the current limiting circuit limits a current on the DC bus(es) to avoid generating big current shock; and when the predetermined duration elapses, that is, when a voltage on the DC buses is close to a voltage of the power supply signal received by the power supply module, the trigger drive circuit sends the drive signal to the current limiting circuit, so that the current limiting circuit does not limit the current on the DC buses, thus realizing soft start of the power supply module. Hence, the following problem can be solved: when the existing power supply module is hot plugged rapidly on the power supply system, a big inrush current may be generated, which may damage the capacitor between the two DC buses and damage the connection terminal connecting the power supply module including the DC buses and the power supply system.

DETAILED DESCRIPTION OF THE INVENTION

The embodiments of the present invention provides a power supply module and a soft start method in which a trigger drive circuit waits for a predetermined duration without sending a drive signal to a current limiting circuit upon receipt of a first notification signal, so that the current limiting circuit limits a current on the DC buses, and the trigger drive circuit sends the drive signal to the current limiting circuit when the predetermined duration elapses, so that the current limiting circuit no longer limits the current on the DC buses, thus realizing soft start of the power supply module, and solving the problem that when the power supply module is hot plugged rapidly on the power supply system, a big inrush current is generated, which may damage a capacitor between the two DC buses and damage a connection terminal connecting the power supply module including the DC buses and the power supply system.

A specific embodiment of the power supply module and the soft start method provided by the embodiments of the present invention will be illustrated below in conjunction with the accompanying drawings.

Figure 5A:
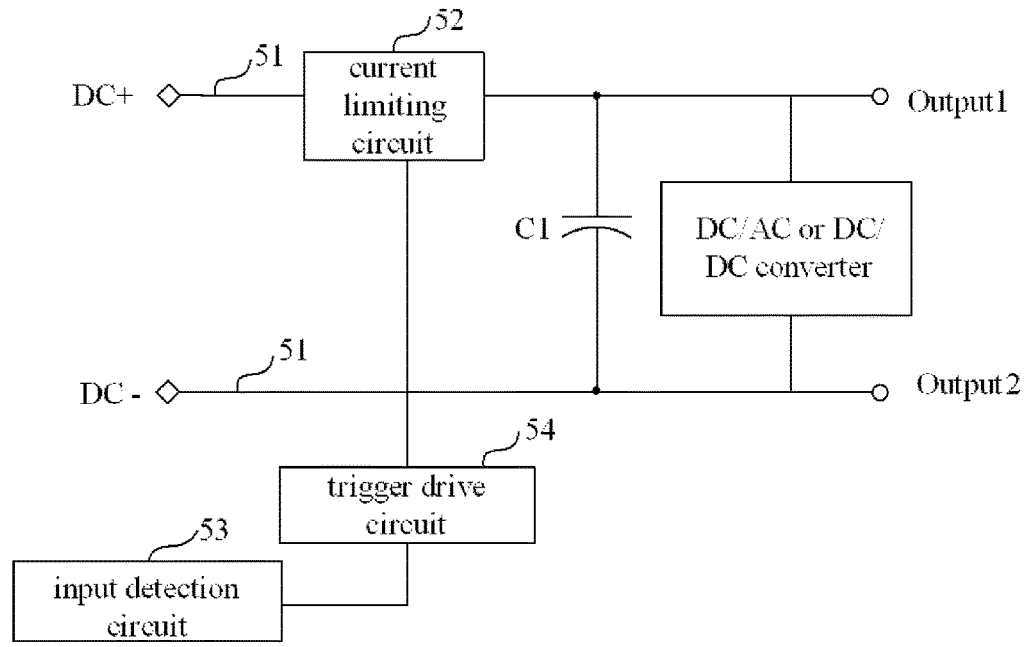
FIG. 5A is a first schematic structural diagram of a power supply module provided by an embodiment of the present invention.
Figure 5B:
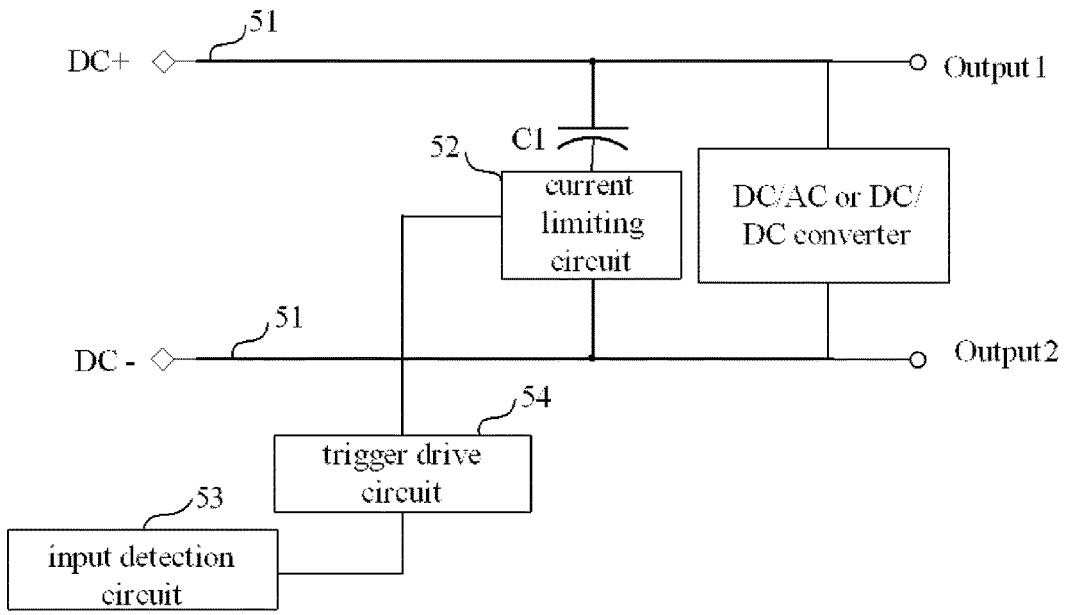
FIG. 5B is a second schematic structural diagram of a power supply module provided by an embodiment of the present invention.

An embodiment of the present invention provides a power supply module. As shown in FIG. 5A and FIG. 5B, the power supply module includes DC buses 51, a current limiting circuit 52, a first capacitor C1, a trigger drive circuit 54 and an input detection circuit 53. In FIG. 5A, the current limiting circuit 52 is connected in a DC bus 51, and the first capacitor C1 is connected between two DC buses 51. In FIG. 5B, the current limiting circuit 52 is connected in series with the first capacitor C1 and then is connected between the two DC buses 51, and the input detection circuit 53 is connected to the trigger drive circuit 54 and the trigger drive circuit 54 is then connected to the current limiting circuit 52.

The input detection circuit 53 is configured to output a first notification signal to the trigger drive circuit 54 when it is determined that the power supply module begins to receive a power supply signal.

The trigger drive circuit 54 is configured to wait for a predetermined duration without sending a drive signal to the current limiting circuit 52 when the first notification signal sent from the input detection circuit 53 is received, and to send the drive signal to the current limiting circuit 52 when the predetermined duration elapses.

The current limiting circuit 52 is configured to limit a current on the DC buses 51 when the drive signal is not received, and not to limit the current on the DC buses 51 when the drive signal is received.

In a case that the current limiting circuit 52 is connected in series with the first capacitor C1 and then is connected between the two DC buses 51, since a current in a branch circuit where the first capacitor C1 is located is less than a current on the DC buses 51, a performance requirement for devices in the current limiting circuit 52 when the current limiting circuit 52 is connected in series in the branch circuit where the first capacitor C1 is located (as shown in FIG. 5B) is lower than a performance requirement for the devices in the current limiting circuit 52 when the current limiting circuit 52 is connected in series in a DC bus (as shown in FIG. 5A). For example, a rated current of a device in the current limiting circuit 52 connected in series in the branch circuit where the first capacitor C1 is located is less than a rated current of the device in the current limiting 52 connected in series in the DC bus.

Figure 1:
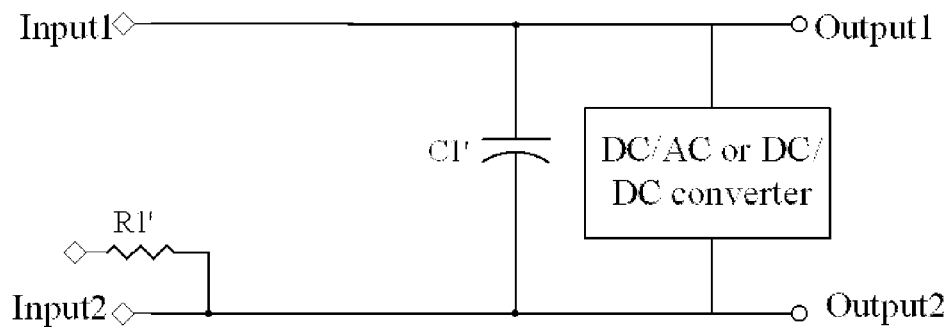
FIGS. 1 to 4 are schematic structural diagrams of power supply modules in the prior art.
Figure 2:
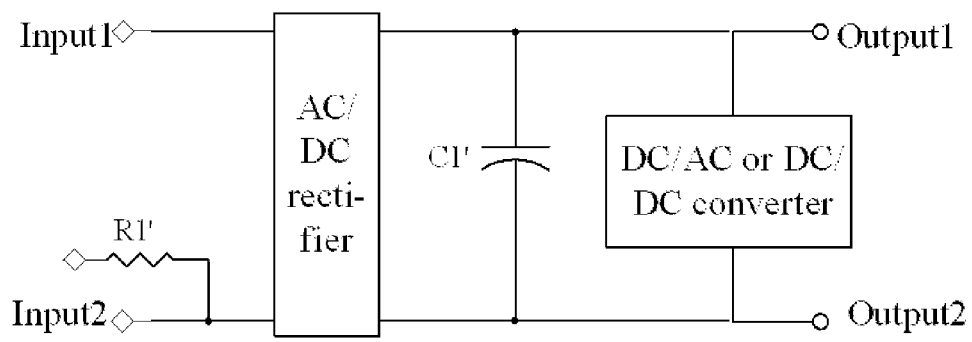
Figure 3:
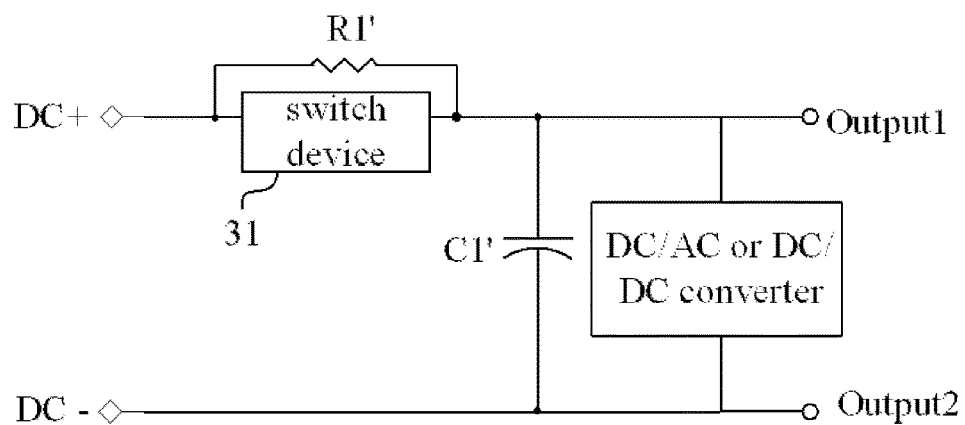
Figure 4:
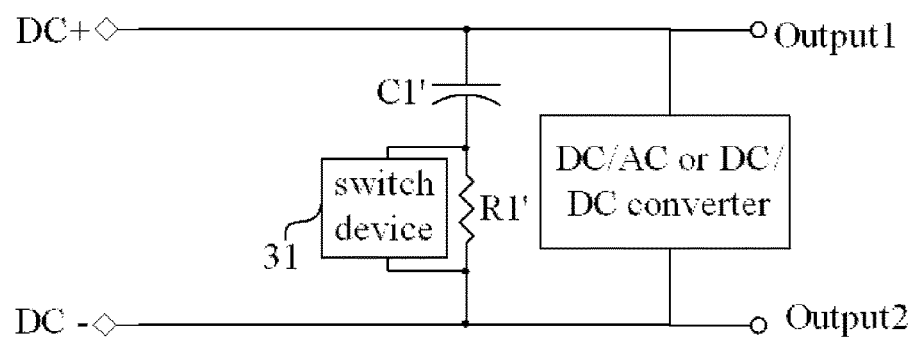

Here the current limiting circuit 52 can employ a structure as shown in FIG. 3 and FIG. 4 in which a switch device is connected in parallel with a current limiting resistor. In such case, the switch device in the current limiting circuit 52 is opened when the current limiting circuit 52 has not received a drive signal sent from the trigger drive circuit 54, and thus a current flows through the current limiting resistor; and the switch device in the current limiting circuit is closed when the current limiting circuit 52 receives the drive signal sent from the trigger drive circuit 54, thus short-circuiting the current limiting resistor connected in parallel with the switch device, and a current flows through the closed switch device. The switch device may be a transistor, a relay or other controllable switch.

The predetermined duration can be determined according to the first capacitor C1 and the current limiting resistor in the current limiting circuit. In order to avoid big current shock, the predetermined duration is generally not less than 10 times of a product of a value of the first capacitor C1 and a resistance value of the current limiting resistor.

Furthermore, the input detection circuit 53 in the power supply module provided by an embodiment of the present invention is further configured to output a second notification signal to the trigger drive circuit 54 when it is determined that the power supply module no longer receives the power supply signal; and the trigger drive circuit 54 is further configured not to send the drive signal to the current limiting circuit 52 when the second notification signal sent from the input detection circuit 53 is received, so that the current limiting circuit 52 limits the current on the DC buses 51.

Figure 6:
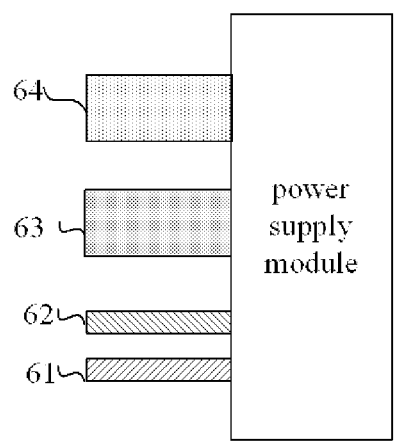
FIG. 6 is a first schematic structural diagram of a connection terminal of a power supply module provided by an embodiment of the present invention.

Furthermore, as shown in FIG. 6, the connection terminals in the power supply module provided by an embodiment of the present invention includes: a first detection joint 61 and a second detection joint 62, wherein each of the first detection joint 61 and the second detection joint 62 is connected to the input detection circuit 53; and other joints than the first detection joint 61 and the second detection joint 62 in the connection terminal of the power supply module when the first detection joint 61 and the second detection joint 62 are short-circuited by a short-circuit joint in the power supply system providing the power supply signal to the power supply module, such as a first power supply joint 63 and a second power supply joint 64, wherein the other joints are connected to corresponding joints in the connection terminal of the power supply system respectively. The first power supply joint 63 in the connection terminal of the power supply module is connected to one of the two DC buses in the power supply module, and the second power supply joint 64 in the connection terminal of the power supply module is connected to the other of the two DC buses in the power supply module.

When the first detection joint 61 and the second detection joint 62 are short-circuited by the short-circuit joint in the connection terminal of the power supply system, it is determined by the input detection circuit that the power supply module begins to receive the power supply signal, and then the input detection circuit outputs the first notification signal; and when the first detection joint 61 and the second detection joint 62 are disconnected, it is determined by the input detection circuit that the power supply module no longer receive the power supply signal, and then the input detection circuit outputs the second notification signal.

Figure 7:
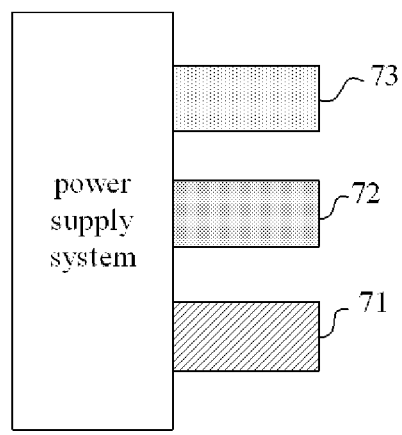
FIG. 7 is a schematic structural diagram of a connection terminal of a power supply system provided by an embodiment of the present invention.

The connection terminal of the power supply system shown in FIG. 7 includes a first joint 71, a second joint 72 and a third joint 73. The first joint is the short-circuit joint, and the second joint 72 and the third joint 73 are configured to output the power supply signal to the power supply module.

When the power supply module provided by the embodiment of the present invention is plugged into the power supply system shown in FIG. 7, the first detection joint 61 and the second detection joint 62 being short-circuited by the short-circuit joint 71 in the power supply system means that each of the first detection joint 61 and the second detection joint 62 in the connection terminal of the power supply module is connected to the first joint 71 in the power supply system. In this case, the first detection joint 61 and the second detection joint 62 in the connection terminal of the power supply module can be short-circuited by the first joint 71 in the power supply system. The other joints than the first detection joint 61 and the second detection joint 62 in the connection terminal of the power supply module being connected to corresponding joints in the connection terminal of the power supply system respectively means that the first power supply joint 63 in the connection terminal of the power supply module is connected to the second joint 72 in the connection terminal of the power supply system and the second power supply joint 64 in the connection terminal of the power supply module is connected to the third joint 73 in the connection terminal of the power supply system.

Figure 8:
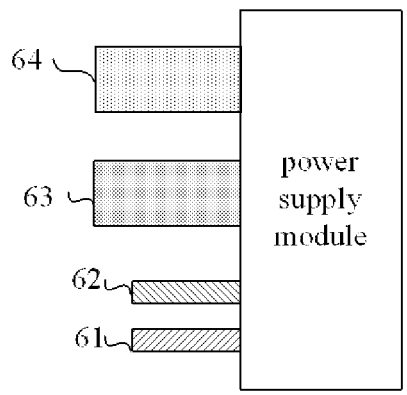
FIG. 8 is a second schematic structural diagram of a connection terminal of a power supply module provided by an embodiment of the present invention.

Furthermore, as shown in FIG. 8, the length of each of the first detection joint 61 and the second detection joint 62 in the connection terminal of the power supply module provided by the embodiment of the present invention is less than the lengths of the other joints than the first detection joint 61 and the second detection joint 62 in the connection terminal of the power supply module. The first power supply joint 63 and the second power supply joint 64 are also included in FIG. 8. In this case, when the first detection joint 61 and the second detection joint 62 in the connection terminal of the power supply module are short-circuited by the short-circuit joint 71 in the connection terminal of the power supply system, the power supply module is connected to the power supply system reliably. When such a connection terminal is employed, it can be avoided that a contact impedance between a joint in the connection terminal of the power supply module and a joint in the connection terminal of the power supply system in a case that the power supply module can operate normally when the power supply module is not connected to the power supply system reliably is greater than an impedance in a case that the power supply module is connected to the power supply system reliably. When the power supply module is heavily loaded, the loss of the connection terminal will increase much more than that in a normal connection, and the connection terminal will be damaged in severe heating.

It is required that the first notification signal and the second notification signal output from the input detection circuit in the embodiment of the present invention have a difference between each other and the difference can be identified by the trigger drive circuit, that is, the trigger drive circuit can distinguish the first notification signal and the second notification signal. For example, the first notification signal and the second notification signal may be digital signals, and the first notification signal is a high-level signal and the second notification signal is a low-level signal, or the first notification signal is a low-level signal and the second notification signal is a high-level signal. The first notification signal and the second notification signal may also be analog signals, and in this case, it is required that a difference between the first notification signal and the second notification signal can be identified by the trigger drive circuit. The difference between the first notification signal and the second notification signal may be a voltage difference, and may also be a current difference.

In the following, a specific embodiment of the input detection circuit is illustrated by taking a case that the first notification signal and the second notification signal are digital signals, and the first notification signal is a low-level signal and the second notification signal is a high-level signal as an example. In practice, of course, a case that the first notification signal is a high-level signal and the second notification signal is a low-level signal can be achieved by changing the connection relationship between devices. Also, digital logic devices can be replaced with analog devices, and the first notification signal and the second notification signal can be distinguished by the trigger drive circuit using a difference between the first notification signal and the second notification signal.

Figure 9A:
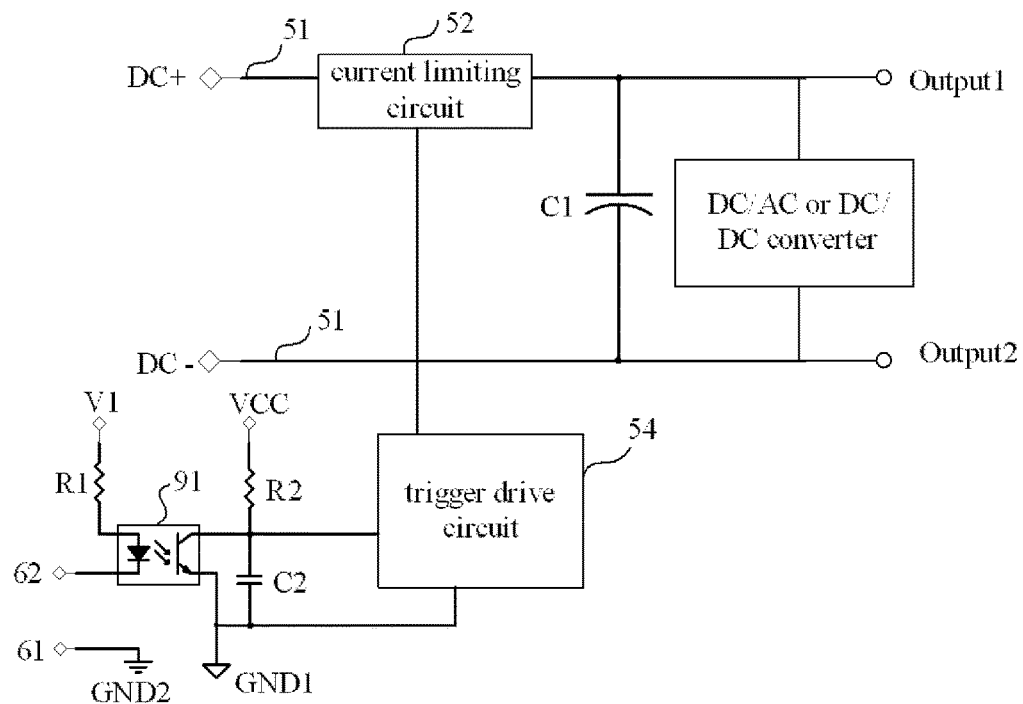
FIG. 9A is a third schematic structural diagram of a power supply module provided by an embodiment of the present invention.
Figure 9B:
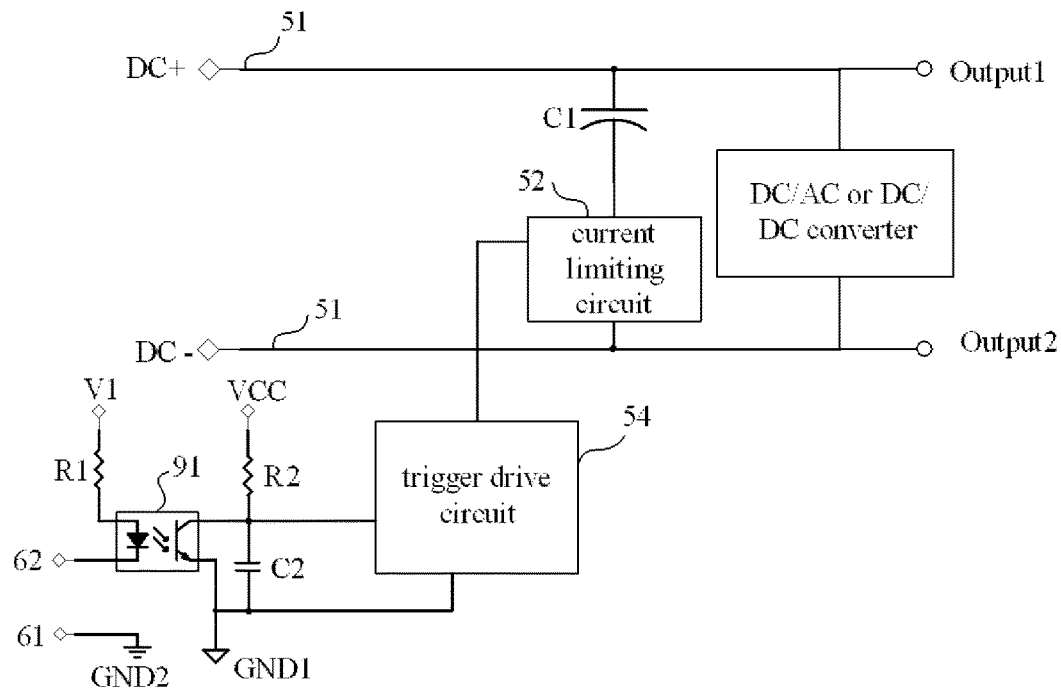
FIG. 9B is a fourth schematic structural diagram of a power supply module provided by an embodiment of the present invention.

As shown in FIG. 9A and FIG. 9B, the input detection circuit in the power supply module provide in an embodiment of the present invention includes a first resistor R1, a second resistor R2, a second capacitor C2 and an optical coupler 91.

One terminal of the first resistor R1 receives a first voltage signal V1. The other terminal of the first resistor R1 is connected to an anode of a light-emitting diode in the optical coupler 91. A cathode of the light-emitting diode in the optical coupler 91 is connected to the second detection joint 62. A collector of a phototransistor in the optical coupler 91 is connected to one terminal of the second resistor R2. The other terminal of the second resistor R2 receives a high-level signal. An emitter of the phototransistor in the optical coupler 91 receives a first ground signal GND1. One terminal of the second capacitor C2 is connected to the collector of the phototransistor in the optical coupler 91 and to the trigger drive circuit 54 respectively. The other terminal of the second capacitor C2 is connected to the emitter of the phototransistor in the optical coupler 91 and to the trigger drive circuit 54 respectively. The first detection joint 61 receives a second ground signal GND2.

The first ground signal GND1 and the second ground signal GND2 may be the same ground signal or different ground signals. When the first ground signal GND1 and the second ground signal GND2 are the different ground signals, the interference of a signal received by the light-emitting diode in the optical coupler 91 to a signal received by the trigger drive circuit 54 can be prevented.

In the FIG. 9A and FIG. 9B, the one terminal of the first resistor R1 receives the first voltage signal V1, and the other terminal of the first resistor R1 may also be connected to the cathode of the light-emitting diode in the optical coupler 91 and the anode of the light-emitting diode in the optical coupler 91 may be connected to the second detection joint 62. Which connection way is used can be determined by the polarity of the first voltage signal V1. When the first voltage signal V1 is a positive voltage signal, the one terminal of the first resistor R1 receives the first voltage signal V1, the other terminal of the first resistor R1 is connected to the anode of the light-emitting diode in the optical coupler 91, and the cathode of the light-emitting diode in the optical coupler 91 is connected to the second detection joint 62. When the first voltage signal V1 is a negative voltage signal, the one terminal of the first resistor R1 receives the first voltage signal V1, the other terminal of the first resistor R1 may also be connected to the cathode of the light-emitting diode in the optical coupler 91, and the anode of the light-emitting diode in the optical coupler 91 is connected to the second detection joint 62.

The optical coupler 91 is configured to output a low-level signal to the trigger drive circuit 54 as the first notification signal when the first detection joint 61 and the second detection joint 62 are short-circuited by the short-circuit joint in the power supply system and thereby the light-emitting diode emits light and the conducting between the collector of the phototransistor and the emitter of the phototransistor is formed; and to output a high-level signal to the trigger drive circuit 54 as the second notification signal when the first detection joint 61 and the second detection joint 62 are disconnected and thereby the light-emitting does not emit light and the conducting between the collector of the phototransistor and the emitter of the phototransistor is broken.

In FIG. 9A, the current limiting circuit 52 is connected in a DC bus 51, and in FIG. 9B, the current limiting circuit 52 being connected in series with the capacitor C1 is connected between the two DC buses 51.

Figure 10A:
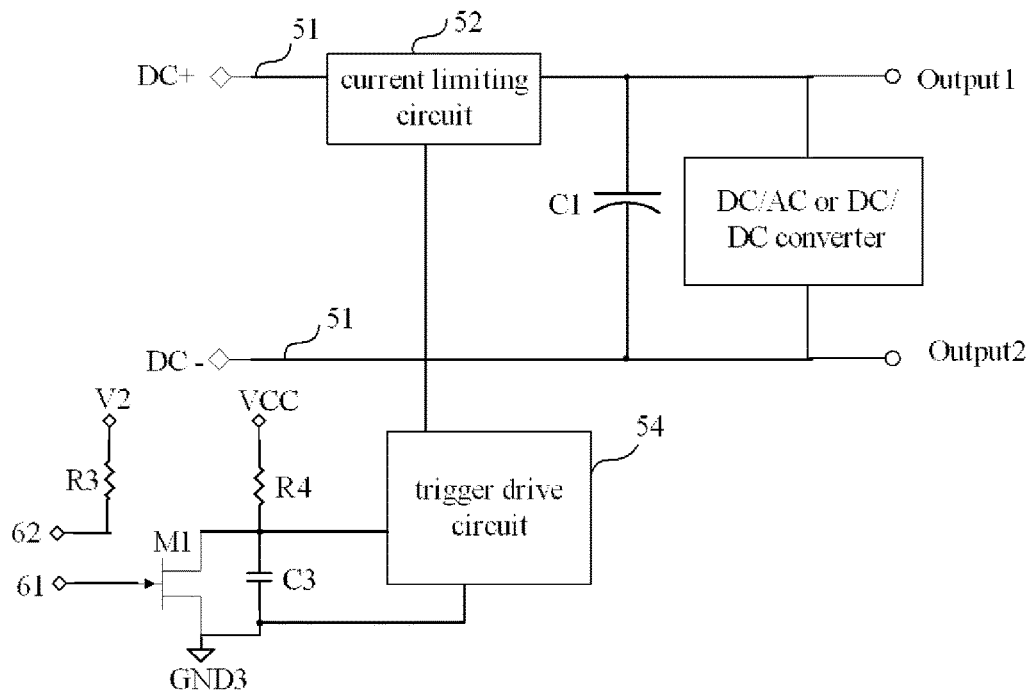
FIG. 10A is a fifth schematic structural diagram of a power supply module provided by an embodiment of the present invention.
Figure 10B:
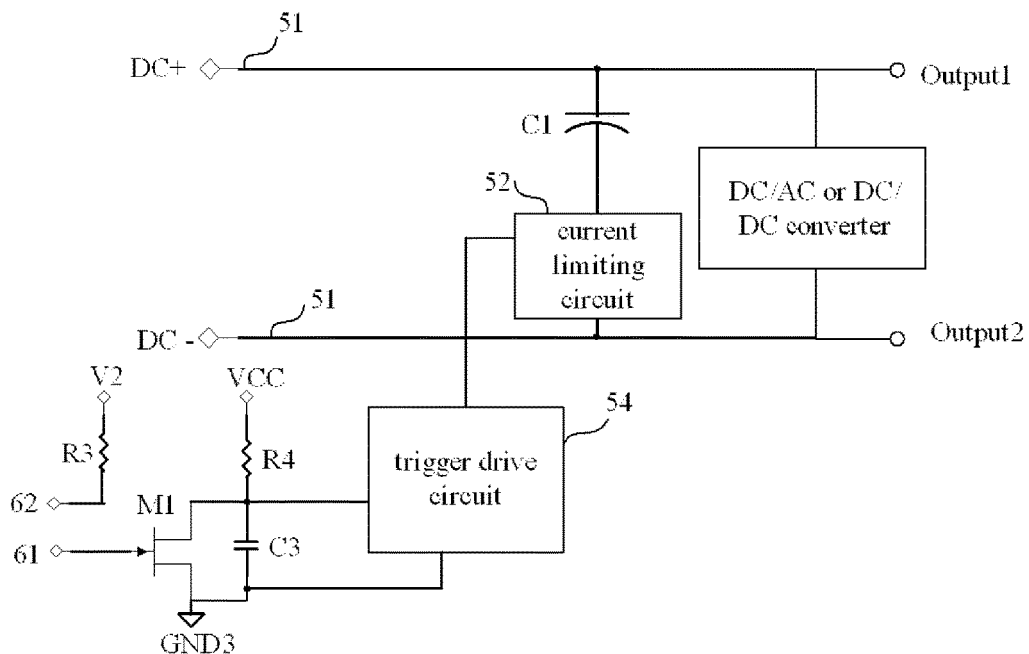
FIG. 10B is a sixth schematic structural diagram of a power supply module provided by an embodiment of the present invention.

Furthermore, as shown in FIG. 10A and 10B, the input detection circuit of the power supply module provided by an embodiment of the present invention includes a third resistor R3, a fourth resistor R4, a third capacitor C3 and a transistor M1.

One terminal of the third resistor R3 receives a second voltage signal V2. The other terminal of the third resistor R3 is connected to the second detection joint 62. A gate electrode of the transistor M1 is connected to the first detection joint 61. A first electrode of the transistor M1 is connected to one terminal of the fourth resistor R4. The other terminal of the fourth resistor R4 receives a high-level signal. A second electrode of the transistor M1 receives a third ground signal GND3. One terminal of the third capacitor C3 is connected to the first electrode of the transistor M1 and to the trigger drive circuit 54 respectively. The other terminal of the third capacitor C3 is connected to the second electrode of the transistor M1 and to the trigger drive circuit 54 respectively.

The transistor M1 is configured to output a low-level signal to the trigger drive circuit 54 as the first notification signal when the first detection joint 61 and the second detection joint 62 are short-circuited by the short-circuit joint in the power supply system and thereby the conducting between the first electrode of the transistor M1 and the second electrode of the transistor M1 is formed; and to output a high-level signal to the trigger drive circuit 54 as the second notification signal when the first detection joint 61 and the second detection joint 62 are disconnected and thereby the conducting between the first electrode of the transistor and the second electrode of the transistor is broken.

When the first electrode of the transistor M1 is a source electrode of the transistor M1, the second electrode of the transistor M1 is a drain electrode of the transistor M1. When the first electrode of the transistor M1 is the drain electrode of the transistor M1, the second electrode of the transistor M1 is the source electrode of the transistor M1.

In FIG. 10A, the current limiting circuit 52 is connected in the DC bus 51. In FIG. 10B, the current limiting circuit 52 is connected between the two DC buses 51 after being connected in series with the capacitor C1.

Figure 11A:
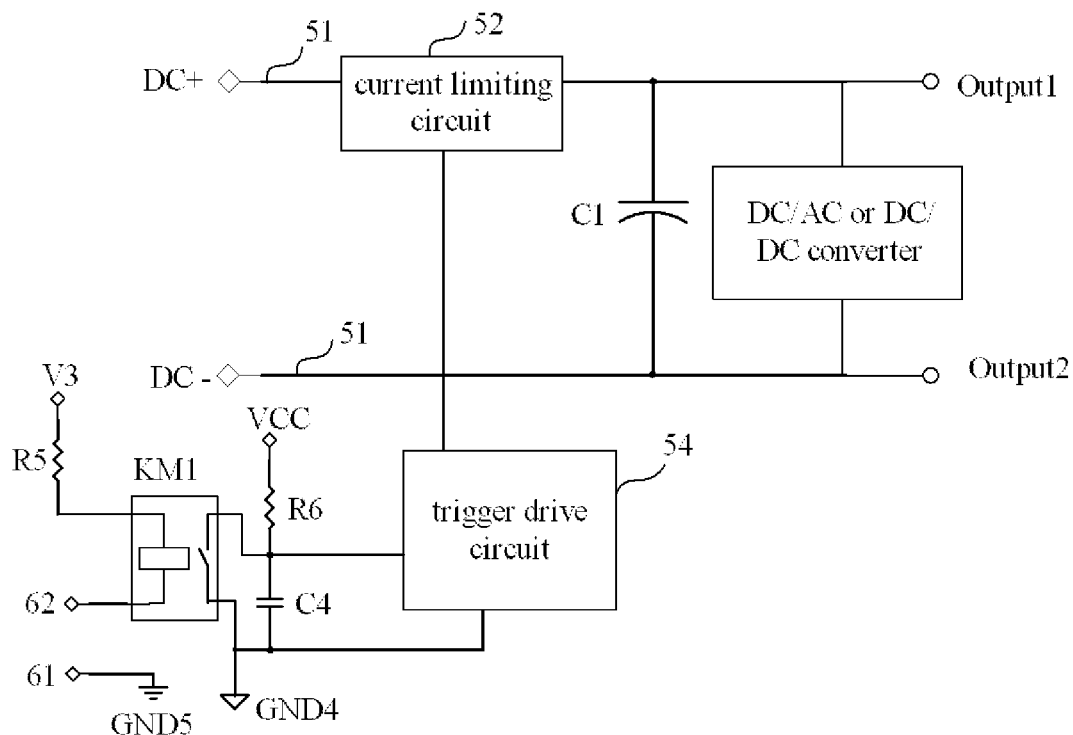
FIG. 11A is a seventh schematic structural diagram of a power supply module provided by an embodiment of the present invention.
Figure 11B:
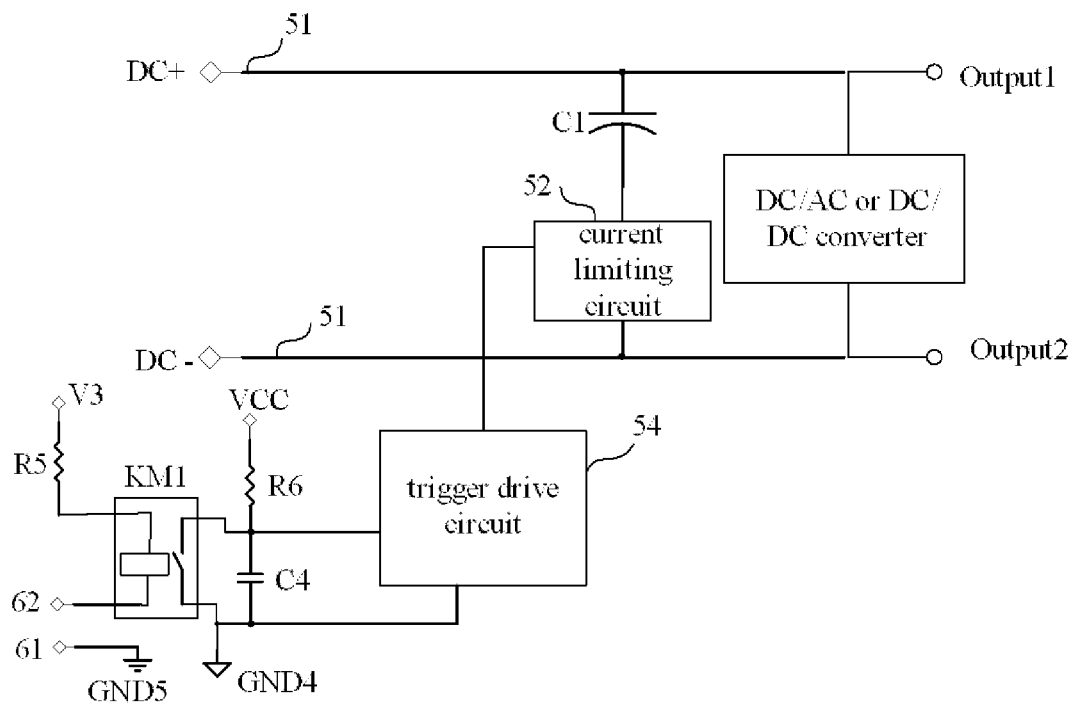
FIG. 11B is an eighth schematic structural diagram of a power supply module provided by an embodiment of the present invention.

Furthermore, as shown in FIG. 11A and FIG. 11B, the input detection circuit in the power supply module provided by an embodiment of the present invention further includes a fifth resistor R5, a sixth resistor R6, a fourth capacitor C4 and a relay KM1.

One terminal of the fifth resistor R5 receives a third voltage signal V3. The other terminal of the fifth resistor R5 is connected to one terminal of a coil in the relay KM1. The other terminal of the coil in the relay KM1 is connected to the second detection joint 62. One terminal of a normally open contact in the relay KM1 is connected to one terminal of the sixth resistor R6. The other terminal of the sixth resistor R6 receives a high-level signal. The other terminal of the normally open contact in the relay KM1 receives a fourth ground signal GND4. One terminal of the fourth capacitor C4 is connected to the one terminal of the normally open contact in the relay KM1 and to the trigger drive circuit 54 respectively. The other terminal of the fourth capacitor C4 is connected to the other terminal of the normally open contact in the relay KM1 and to the trigger drive circuit 54 respectively. The first detection joint 61 receives a fifth ground signal GND5.

The relay KM1 is configured such that when the first detection joint 61 and the second detection joint 62 are short-circuited by the short-circuit joint in the power supply system, the normally open contact in the relay KM1 is closed, and thus a low-level signal is output to the trigger drive circuit 54 as the first notification signal; and when the first detection joint 61 and the second detection joint 62 are disconnected, the normally open contact in the relay KM1 is open, and thus a high-level signal is output to the trigger drive circuit 54 as the second notification signal.

In FIG. 11A, the current limiting circuit 52 is connected in the DC bus 51. In FIG. 11B, the current limiting circuit 52 is connected between the two DC buses 51 after being connected in series with the capacitor C1.

The fourth ground signal GND4 and the fifth ground signal GND5 may be the same ground signal, and may also be different ground signals. When the fourth ground signal GND4 and the fifth ground signal GND5 are the different ground signals, the interference of a signal received by the coil in the relay KM1 to a signal received by the trigger drive circuit 54 can be prevented.

The trigger drive circuit described above includes a DSP minimal system and a driver circuit. The DSP is configured to monitor whether the power supply signal has been received or the power supply signal is no longer received, and to realize a delay function. The driver circuit is configured to provide a drive signal to the switch device in the current limiting circuit.

A soft start method provided by an embodiment of the present invention operates based upon the power supply module provided by an embodiment of the present invention. The principle for starting the power supply module provided by the embodiment of the present invention by means of this method is identical to the starting principle of the power supply module provided by the embodiment of the present invention, and the same part will not be repeated.

The soft start method provided by the embodiment of the present invention includes:

outputting, by an input detection circuit, a first notification signal to a trigger drive circuit when it is determined that the power supply module begins to receive a power supply signal;

waiting for a predetermined duration without sending a drive signal to a current limiting circuit by the trigger drive circuit when the first notification signal sent from the input detection circuit is received; and sending, by the trigger drive circuit, the drive signal to the current limiting circuit when the predetermined duration elapses; and limiting, by the current limiting circuit, a current on a DC bus when the drive signal is not received; and not limiting, by the current limiting circuit, the current on the DC bus when the drive signal is received.

Furthermore, the soft start method provided by an embodiment of the present invention further includes:

outputting, by the input detection circuit, a second notification signal to the trigger drive module when it is determined that the power supply module no longer receives the power supply signal; and not sending, by the trigger drive circuit, the drive signal to the current limiting circuit when the second notification signal sent from the input detection circuit has been received, so that the current limiting circuit limits the current on the DC bus.

Furthermore, when any power supply module shown in FIG. 6, FIG. 8, FIG. 9A, FIG. 9B, FIG. 10A, FIG. 10B, FIG. 11A and FIG. 11B is employed as the power supply module provided by the embodiment of the present invention and the power supply system shown in FIG. 7 is employed as a power supply system, in the soft start method provided by the embodiment of the present invention, the outputting, by an input detection circuit, a first notification signal to a trigger drive circuit when it is determined that the power supply module begins to receive a power supply signal includes:

determining, by the input detection circuit, that the power supply module begins to receive the power supply signal when the first detection joint and the second detection joint are short-circuited by a short-circuit joint in the power supply system; and outputting, by the input detection circuit, the first notification signal to the trigger drive circuit.

Furthermore, when any power supply module shown in FIG. 6, FIG. 8, FIG. 9A, FIG. 9B, FIG. 10A, FIG. 10B, FIG. 11A and FIG. 11B is employed as the power supply module provided by the embodiment of the present invention the power supply system shown in FIG. 7 is employed as a power supply system, in the soft start method provided by the embodiment of the present invention, the outputting, by the input detection circuit, a second notification signal to the trigger drive circuit when it is determined that the power supply module no longer receives the power supply signal includes:

determining, by the input detection circuit, that the power supply module no longer receives the power supply signal when the first detection joint and the second detection joint are disconnected; and outputting, by the input detection circuit, the second notification signal to the trigger drive circuit.

Furthermore, when any power supply module shown in FIG. 9A, FIG. 9B, FIG. 10A, FIG. 10B, FIG. 11A and FIG. 11B is employed as the power supply module provided by the embodiment of the present invention, the first notification signal output from the input detection circuit to the trigger drive circuit is a low-level signal, and the second notification signal output from the input detection circuit to the trigger drive circuit is a high-level signal.

Figure 12:
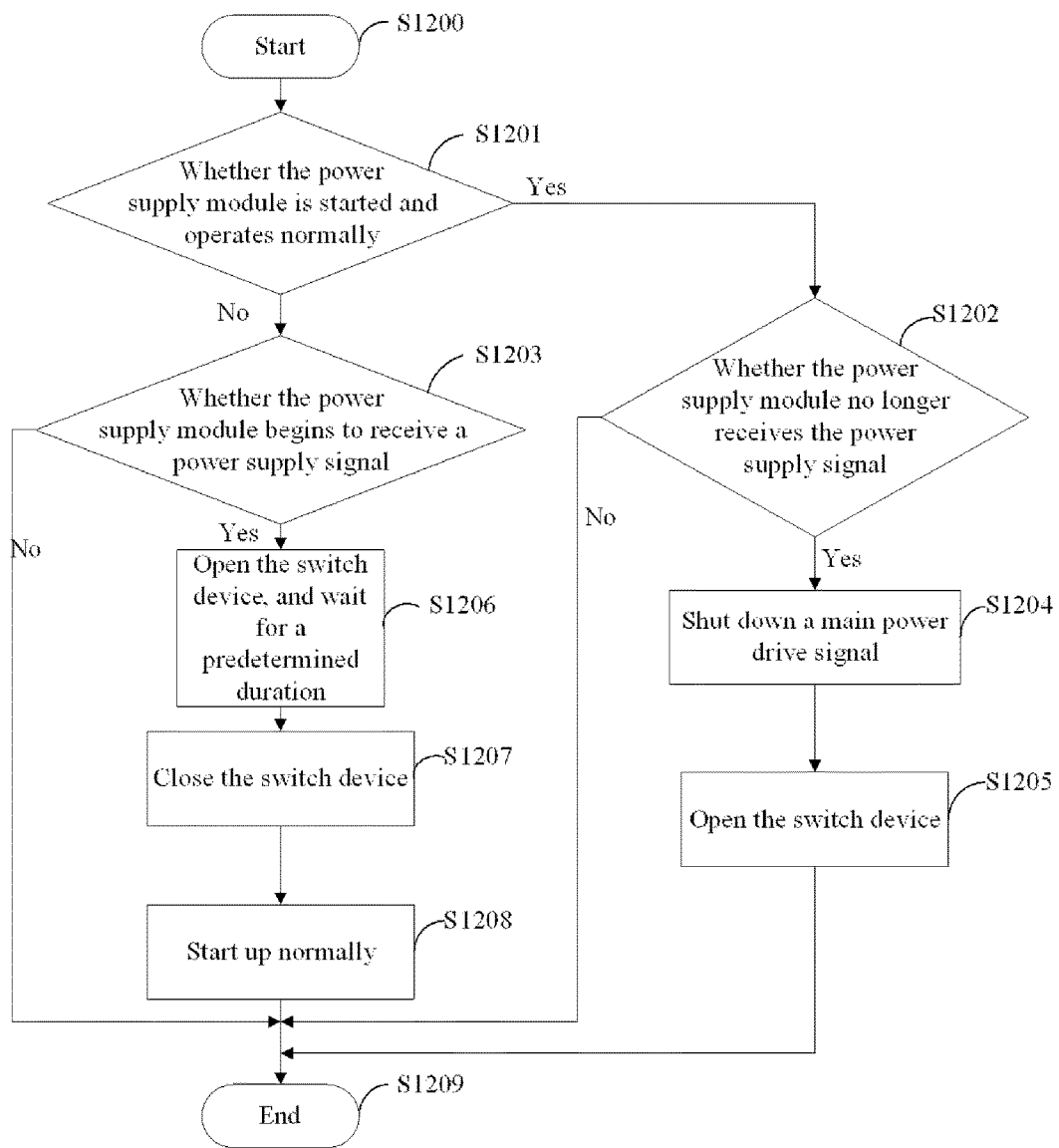
FIG. 12 is a flow chart of a soft start method provided by an embodiment of the present invention in a practical application.

Furthermore, in practical application, the soft start method provided by the embodiment of the present invention can employ a flow shown in FIG. 12 which includes the followings.

In step S1200, it is started to perform a program related to the power supply module.

In step S1201, it is determined whether the power supply module is started and operates normally. If the power supply module is started and operates normally, a step S1202 is performed; otherwise, a step S1203 is performed.

In step S1202, it is determined whether the power supply module no longer receives the power supply signal. If the power supply module no longer receives the power supply signal, a step S1204 is performed; otherwise, the step S1209 is performed.

In step S1203, it is determined whether the power supply module begins to receive the power supply signal. If the power supply module begins to receive the power supply signal, a step S1206 is performed; otherwise, the step S1209 is performed.

In step S1204, a main power drive signal is shut down, and then a step S1205 is performed.

In step S1205, the switch device is open by shutting down the drive signal of the switch device in the current limiting circuit.

In step S1206, the switch device in the current limiting circuit is open, and a predetermined duration is waited for.

In step S1207, the drive signal is output to the switch device in the current limiting circuit when the predetermined duration elapses, so that the switch device is closed.

In step S1208, other start step such as a step of enabling the main power drive signal is performed.

In step S1209, the process related to the power supply module is completed.

In practice, the step S1204 is performed first and then the step S1205 is performed. In this way, not only the inrush current can be prevented from being generated during a fast hot plug, but also a big ripple current can also be prevented from flowing through the current limiting resistor in the current limiting circuit during a slow hot plug.

Figure 13:
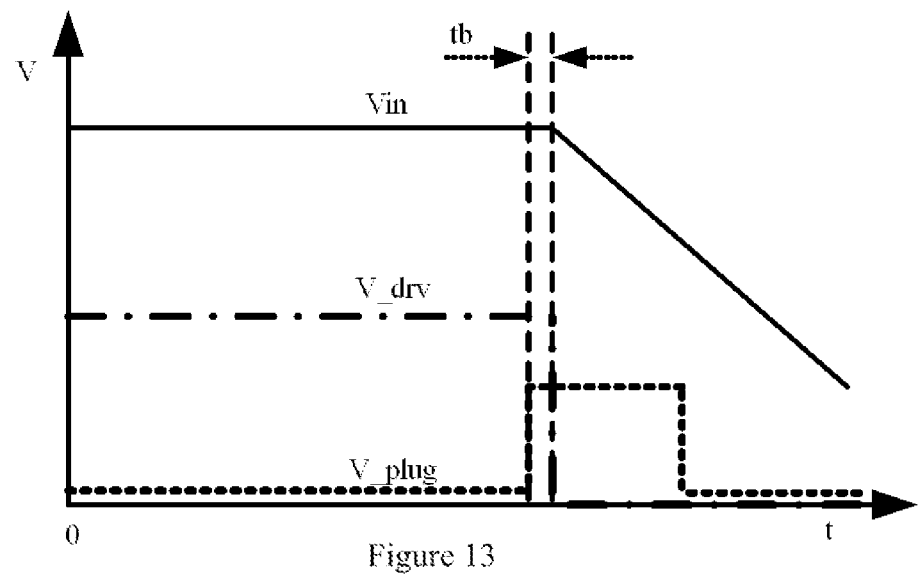
FIGS. 13 to 14 are schematic diagrams of signals at respective points of a power supply module provided by an embodiment of the present invention in a practical application.

When the power supply module changes from a started and normal operation state to a state of no longer receiving the power supply signal, signals at respective points of the power supply module is shown in FIG. 13. In FIG. 13, Vin represents a signal on the first power supply joint or the second power supply joint of the power supply module. V_drv represents a drive signal of the main power switch device which is configured to control whether to output a power supply signal to a DC/AC converter or a DC/DC converter and a user load outside of the power supply module. V_plug represents the first notification signal and the second notification signal, and a low-level V_plug is the first notification signal and a high-level V_plug is the second notification signal. Since the first detection joint and the second detection joint are shorter than other joints in the connection terminal of the power supply module, when the power supply module is pulled out from the power supply system, the first detection joint and the second detection joint are disconnected first, and then the first power supply joint and the second power supply joint in the connection terminal of the power supply module are disconnected from the corresponding joints in the connection terminal of the power supply system. Therefore, $t_b$ represents a time period between a time when the first detection joint and the second detection joint are disconnected and a time when the first power supply joint and the second power supply joint in the connection terminal of the power supply module are disconnected from the corresponding joints in the connection terminal of the power supply system.

Figure 14:
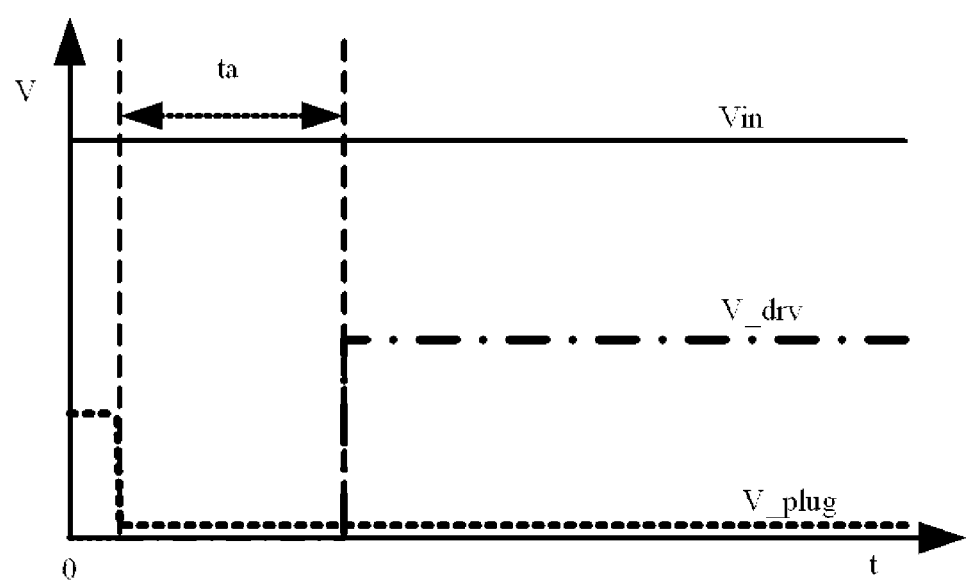

When the power supply module changes from a non-started and normal operation state to a state of receiving the power supply signal, signals at respective points of the power supply module is showed in FIG. 14. In FIG. 14, Vin represents a signal on the first power supply joint or the second power supply joint in the power supply module. V_drv represents a drive signal of the main power switch device which is configured to control whether to output a power supply signal to a DC/AC converter or a DC/DC converter and a user load outside of the power supply module. V_plug represents the first notification signal and the second notification signal, and a low-level V_plug is the first notification signal and a high-level V_plug is the second notification signal. $t_a$ represents the predetermined duration. Since the first detection joint and the second detection joint are shorter than other joints in the connection terminal of the power supply module, when the power supply module is plugged into the power supply system, the first power supply joint and the second power supply joint in the connection terminal of the power supply module are first connected to the corresponding joints in the connection terminal of the power supply system, the first detection joint and the second detection joint are then connected to the short-circuit joint in the connection terminal of the power supply system, and the first detection joint and the second detection joint are short-circuited by the short-circuit joint. Therefore, a time period between a time 0 and a time $t_a$ represents a time period between a time when the first power supply joint and the second power supply joint in the connection terminal of the power supply module are connected to the corresponding joints in the connection terminal of the power supply system and a time when the first detection joint and the second detection joint are connected to the short-circuit joint in the connection terminal of the power supply system.

Through the above description of the embodiments, it can be known by those skilled in the art that the embodiments of the present invention can be implemented by hardware, and can also be implemented by software with a necessary universal hardware platform. Based upon such understanding, the technical solutions of the embodiments of the present invention can be embodied in a way of a software product, the software product may be stored in a non-volatile storage medium (which may be a Compact Disk-Read Only Memory (CD-ROM), a Universal Serial Bus (USB) or a mobile hard disk drive), and include multiple instructions to make a computer equipment (which may be a personal computer, a server or a network equipment) perform the method described in various embodiments of the present invention.

It should be understood by those skilled in the art that the accompanying drawings are just schematic diagrams of a preferred embodiment, and modules and flows in the accompanying drawings may be not necessary for implementing the present invention.

It should be understood by those skilled in the art that the modules of the apparatus in the embodiment can be distributed in the apparatus of the embodiment according to the description of the embodiment, and can also be distributed in one or more apparatuses different from this embodiment by a corresponding change. The modules in the embodiment described above may be integrated into one module, and may also be further divided into multiple sub-modules.

Sequence numbers of the embodiments of the present invention described above are only used for description, and do not intend to represent superiority and inferiority of the embodiments.

It is apparent that various modifications and variations can be made to the present invention by those skilled in the art without departing from the spirit and scope of the present invention. Accordingly, the present invention intends to include these modifications and variations to the present invention if these modifications and variations fall within the scope of the claims of the present invention and the equivalents thereof.

The invention claimed is:

1. A power supply module, comprising:
   at least two Direct Current (DC) buses;
   a capacitor coupled between the at least two DC buses;
   a current limiting circuit including at least one current limiting resistor, the current limiting circuit coupled to at least one of the DC buses;
   a connection terminal having a first detection joint and a second detection joint; and
   an input detection circuit coupled to at least one of the first detection joint and the second detection joint and configured to output a first notification signal to a trigger drive circuit when it is determined, by detecting a short-circuit between the first detection joint and the second detection joint, that the power supply module begins to receive a power supply signal;
   the trigger drive circuit configured to wait for a predetermined duration without sending a drive signal to the current limiting circuit when the first notification signal sent from the input detection circuit is received by the trigger drive circuit, and to send the drive signal to the current limiting circuit when the predetermined duration elapses, the predetermined duration determined according to values of the capacitor coupled between the at least two DC buses, and the current limiting resistor of the current limiting circuit; and
   the current limiting circuit configured to limit a current on at least one of the DC buses of the power supply module when the drive signal is not received by the current limiting circuit, and not to limit the current on said at least one of the DC buses when the drive signal is received by the current limiting circuit.

2. The power supply module according to claim 1, wherein:
   the input detection circuit is further configured to output a second notification signal to the trigger drive circuit when it is determined that the power supply module no longer receives the power supply signal; and
   the trigger drive circuit is further configured not to send the drive signal to the current limiting circuit when the second notification signal sent from the input detection circuit is received by the trigger drive circuit.

3. The power supply module according to claim 2, wherein: when the first detection joint and the second detection joint are short-circuited by a short-circuit joint in a connection terminal of a power supply system providing the power supply signal to the power supply module, joints other than the first detection joint and the second detection joint in the connection terminal of the power supply module are connected to corresponding joints in the connection terminal of the power supply system respectively; and when the first detection joint and the second detection joint are short-circuited by the short-circuit joint in the connection terminal of the power supply system, the input detection circuit outputs the first notification signal, and when the first detection joint and the second detection joint are disconnected, the input detection circuit outputs the second notification signal.

4. The power supply module according to claim 3, wherein the length of each of the first detection joint and the second detection joint in the connection terminal of the power supply module is less than the lengths of other joints in the connection terminal of the power supply module.

5. The power supply module according to claim 3, wherein the input detection circuit comprises: a first resistor, a second resistor, a second capacitor and an optical coupler;

one terminal of the first resistor receives a first voltage signal, the other terminal of the first resistor is connected to a first electrode of a light-emitting diode in the optical coupler, and a second electrode of the light-emitting diode in the optical coupler is connected to the second detection joint; a collector of a phototransistor in the optical coupler is connected to one terminal of the second resistor, the other terminal of the second resistor receives a high-level signal, and an emitter of the phototransistor in the optical coupler receives a first ground signal; one terminal of the second capacitor is connected to the collector of the phototransistor in the optical coupler and to the trigger drive circuit respectively, and the other terminal of the second capacitor is connected to the emitter of the phototransistor in the optical coupler and to the trigger drive circuit respectively; the first detection joint receives a second ground signal; and the optical coupler is configured to output a low-level signal to the trigger drive circuit when the first detection joint and the second detection joint are short-circuited by the short-circuit joint in the power supply system and thereby the light-emitting diode emits light and the conducting between the collector of the phototransistor and the emitter of the phototransistor is formed, and to output a high-level signal to the trigger drive circuit when the first detection joint and the second detection joint are disconnected and thereby the light-emitting diode does not emit light and the conducting between the collector of the phototransistor and the emitter of the phototransistor is broken.

6. The power supply module according to claim 3, wherein the input detection circuit comprises: a first resistor, a second resistor, a second capacitor and a transistor;

one terminal of the first resistor receives a voltage signal, and the other terminal of the first resistor is connected to the second detection joint; a gate electrode of the transistor is connected to the first detection joint, a first electrode of the transistor is connected to one terminal of the second resistor, the other terminal of the second resistor receives a high-level signal, a second electrode of the transistor receives a ground signal, one terminal of the second capacitor is connected to the first electrode of the transistor and to the trigger drive circuit respectively, and the other terminal of the second capacitor is connected to a second electrode of the transistor and to the trigger drive circuit respectively; and the transistor is configured to output a low-level signal to the trigger drive circuit when the first detection joint and the second detection joint are short-circuited by the short-circuit joint in the power supply system and thereby the conducting between the first electrode of the transistor and the second electrode of the transistor is formed, and to output a high-level signal to the trigger drive circuit when the first detection joint and the second detection joint are disconnected and thereby the conducting between the first electrode of the transistor and the second electrode of the transistor is broken.

7. The power supply module according to claim 3, wherein the input detection circuit comprises: a first resistor, a second resistor, a second capacitor and a relay;

one terminal of the first resistor receives a voltage signal, the other terminal of the first resistor is connected to one terminal of a coil in the relay, and the other terminal of the coil in the relay is connected to the second detection joint; one terminal of a normally open contact in the relay is connected to one terminal of the second resistor, the other terminal of the relay receives a high-level signal, and the other terminal of the normally open contact in the relay receives a first ground signal; one terminal of the second capacitor is connected to the one terminal of the normally open contact in the relay and to the trigger drive circuit respectively, and the other terminal of the second capacitor is connected to the other terminal of the normally open contact in the relay and to the trigger drive circuit respectively; the first detection joint receives a second ground signal; and the relay is configured to output a low-level signal to the trigger drive circuit when the first detection joint and the second detection joint are short-circuited by the short-circuit joint in the power supply system and thereby the normally open contact in the relay is closed, and to output a high-level signal to the trigger drive circuit when the first detection joint and the second detection joint are disconnected and thereby the normally open contact in the relay is open.

8. The power supply module according to claim 1, wherein the current limiting circuit is connected in at least one of the DC buses of the power supply module, or the current limiting circuit is connected in series with the capacitor of the power supply module and then is connected between the two DC buses of the power supply module.

9. A soft start method, comprising:

outputting, by an input detection circuit, a first notification signal to a trigger drive circuit when it is determined, by detecting a short-circuit between a first detection joint and a second detection joint of a connection terminal of a power supply module, that the power supply module begins to receive a power supply signal;

waiting for a predetermined duration without sending a drive signal to a current limiting circuit by the trigger drive circuit when the first notification signal sent from the input detection circuit is received by the trigger drive circuit, and sending, by the trigger drive circuit, the drive signal to the current limiting circuit when the predetermined duration elapses, the predetermined duration determined according to values of a current limiting resistor of the current limiting circuit and a capacitor coupled between two DC buses of the power supply module; and limiting, by the current limiting circuit, a current on at least one of the two DC buses of the power supply module when the drive signal is not received by the current limiting circuit, and not limiting, by the current limiting circuit, the current on said at least one of the two DC buses when the drive signal is received by the current limiting circuit.

10. The method according to claim 9, further comprising:
outputting, by the input detection circuit, a second notification signal to the trigger drive circuit when it is determined that the power supply module no longer receives the power supply signal; and
not sending, by the trigger drive circuit, the drive signal to the current limiting circuit when the second notification signal sent from the input detection circuit is received by the trigger drive circuit.

11. The method according to claim 9, wherein the outputting, by the input detection circuit, the first notification signal to the trigger drive circuit comprises:
outputting, by the input detection circuit, the first notification signal when the first detection joint and the second detection joint in the connection terminal of the power supply module are short-circuited by a short-circuit joint in a power supply system providing the power supply signal to the power supply module.

12. The method according to claim 11, wherein the outputting, by the input detection circuit, the second notification signal to the trigger drive circuit when it is determined that the power supply module no longer receives the power supply signal comprises:
outputting, by the input detection circuit, the second notification signal when the first detection joint and the second detection joint are disconnected.

13. The method according to claim 11, wherein the first notification signal is a low-level signal.

14. The method according to claim 12, wherein the second notification signal is a high-level signal.

15. The power supply module of claim 1, wherein the trigger drive circuit comprises a digital signal processor (DSP) configured to monitor whether the power supply signal has been received and implement a delay function corresponding to the predetermined duration.

* * * * *